United States Patent
Huang et al.

(10) Patent No.: US 11,239,142 B2
(45) Date of Patent: Feb. 1, 2022

(54) PACKAGE STRUCTURE AND METHOD FOR FORMING THE SAME

(71) Applicant: Taiwan Semiconductor Manufacturing Co., Ltd., Hsinchu (TW)

(72) Inventors: Chih-Fan Huang, Kaohsiung (TW); Hsiang-Ku Shen, Hsinchu (TW); Hui-Chi Chen, Zhudong Township, Hsinchu County (TW); Tien-I Bao, Taoyuan (TW); Dian-Hau Chen, Hsinchu (TW); Yen-Ming Chen, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/656,879

(22) Filed: Oct. 18, 2019

(65) Prior Publication Data

US 2021/0118782 A1   Apr. 22, 2021

(51) Int. Cl.
*H01L 23/495* (2006.01)
*H01L 23/522* (2006.01)
*H01L 23/48* (2006.01)

(52) U.S. Cl.
CPC ...... *H01L 23/49589* (2013.01); *H01L 23/481* (2013.01); *H01L 23/5225* (2013.01); *H01L 2224/0401* (2013.01)

(58) Field of Classification Search
CPC ............. H01L 23/49589; H01L 23/481; H01L 23/5225
See application file for complete search history.

(56) References Cited

U.S. PATENT DOCUMENTS

| 6,198,123 B1* | 3/2001 | Linder | H01L 28/40 257/298 |
| 6,545,926 B2* | 4/2003 | Ooishi | G11C 29/70 365/149 |
| 2003/0062564 A1* | 4/2003 | Kobayashi | H01L 28/60 257/306 |
| 2003/0089937 A1* | 5/2003 | Yamauchi | H01L 23/5225 257/296 |
| 2004/0232497 A1* | 11/2004 | Akiyama | H01L 27/1052 257/390 |
| 2010/0224960 A1* | 9/2010 | Fischer | H01L 23/5223 257/532 |
| 2010/0276796 A1* | 11/2010 | Andry | H01L 25/18 257/692 |
| 2013/0270675 A1* | 10/2013 | Childs | H01L 23/5226 257/532 |

* cited by examiner

*Primary Examiner* — Peniel M Gumedzoe
(74) *Attorney, Agent, or Firm* — Birch, Stewart, Kolasch & Birch, LLP

(57) ABSTRACT

A package structure and method for forming the same are provided. The package structure includes a conductive layer formed over a first substrate, and a dielectric layer formed over the conductive layer. The package structure includes a metal-insulator-metal (MIM) capacitor embedded in the dielectric layer, and a shielding layer formed over the MIM capacitor. The shielding layer is insulated from the MIM capacitor by the dielectric layer. The package structure also includes a first through via formed through the MIM capacitor, and the first through via is connected to the conductive layer, and the first through via is insulated from the shielding layer.

20 Claims, 12 Drawing Sheets

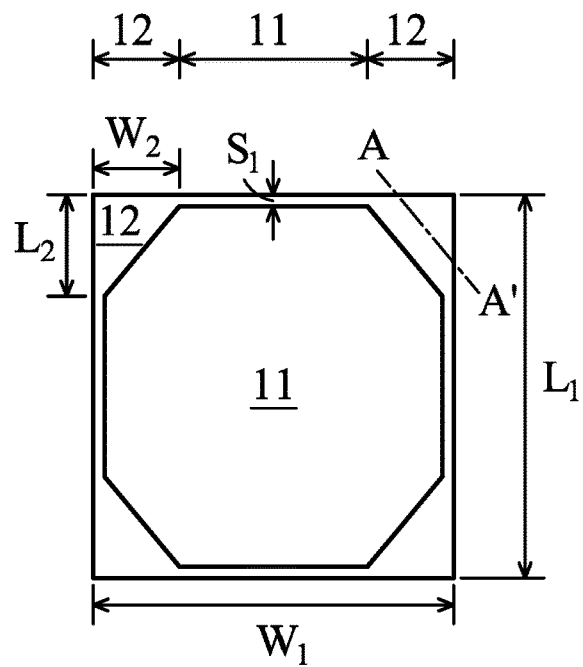 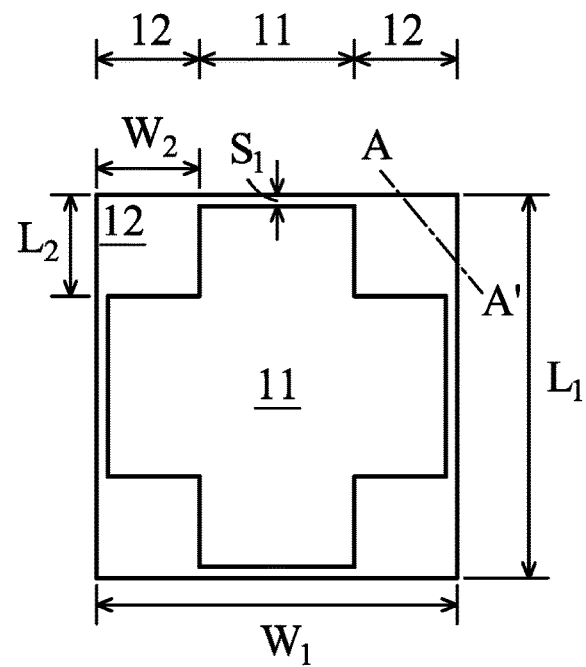
FIG. 2A    FIG. 2B
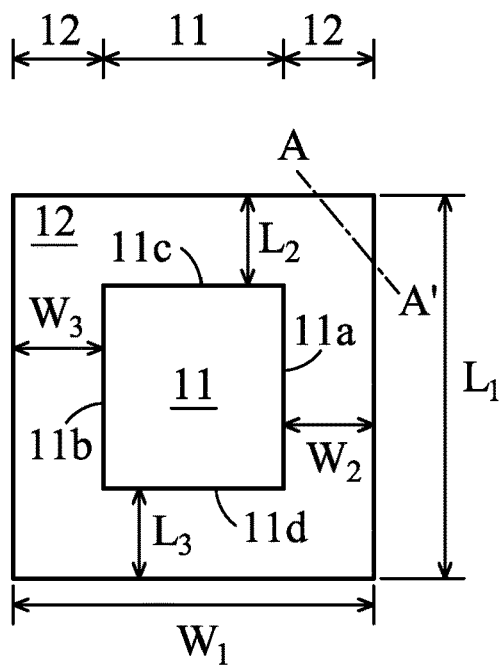 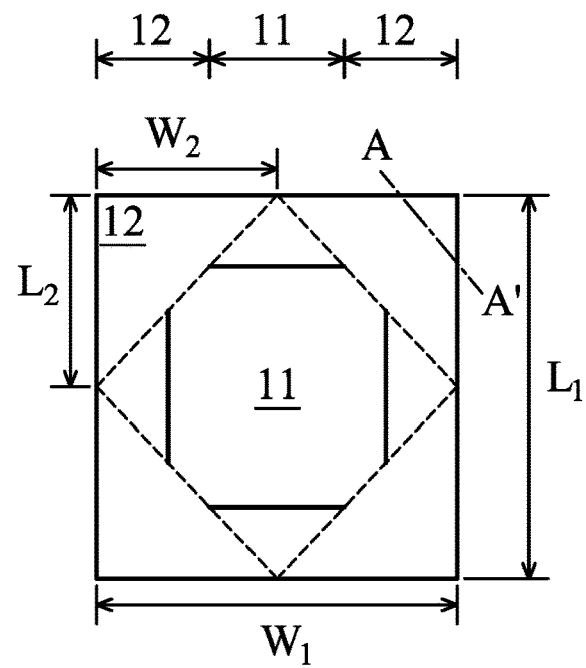
FIG. 2C    FIG. 2D

PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions can be integrated together.

Although existing package structures and methods of fabricating a package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2D show top-view representations of the die structure, in accordance with some embodiments of the disclosure.

DETAILED DESCRIPTION

Figure 1A:
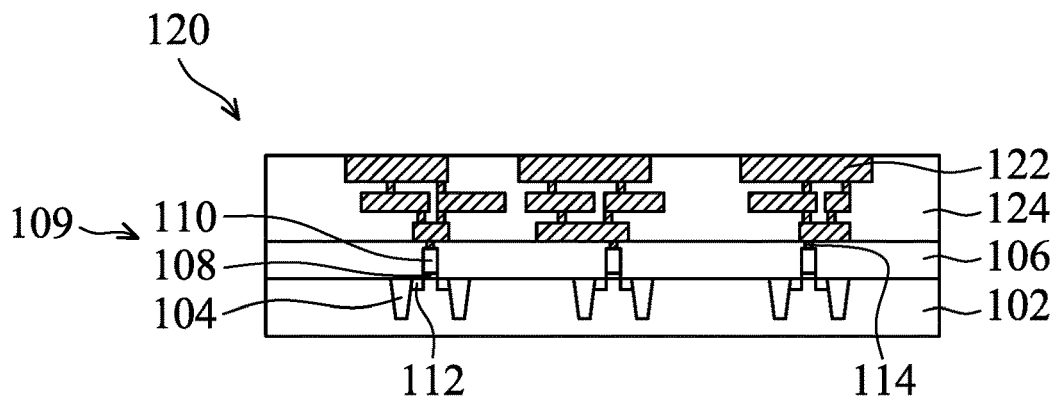
FIGS. 1A-1J show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a package structure and method for forming the same are provided. FIGS. 1A-1J show cross-sectional representations of various stages of forming a package structure 300a, in accordance with some embodiments of the disclosure. In some embodiments, the package structure 300a may be a chip-on-wafer-on-substrate (CoWoS) package or another suitable package. The package structure 100a includes a metal-insulator-metal (MIM) capacitor formed over a top metal layer of an interconnect structure. A shielding layer is formed over the MIM capacitor to prevent the crack extending into the MIM capacitor. Therefore, the quality, the yield and reliability of the package structure are improved.

As shown in FIG. 1A, a substrate 102 is provided. The substrate 102 includes a front surface 102a and a back surface 102b. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

As shown in FIG. 1A, an isolation structure 104, such as shallow trench isolation (STI) structures is formed in the substrate 102. A dielectric layer 106 is formed over the substrate 102, and a gate structure 109 embedded in the dielectric layer 106. The gate structure 109 includes a gate dielectric layer 108 and a gate electrode 110. A source/drain structure 112 is formed in the substrate 102 and next to the gate structure 109. A contact structure 114 is formed over the gate structure 109.

An interconnect structure 120 is formed over the dielectric layer 106. The interconnect structure 120 may be used as a redistribution (RDL) structure for routing. The interconnect structure 120 includes multiple conductive layers 122 formed in multiple dielectric layers 124.

The dielectric layers 124 may be made of or include one or more polymer materials. The polymer material(s) may include polybenzoxazole (PBO), polyimide (PI), one or more other suitable polymer materials, or a combination thereof. In some embodiments, some or all of the dielectric layers 124 are made of or include dielectric materials other than polymer materials. The dielectric material may include silicon oxide, silicon carbide, silicon nitride, silicon oxynitride, one or more other suitable materials, or a combination thereof.

The conductive layers 122 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive layers 122 are formed by an electroplating, electroless plating, printing, a chemical vapor deposition (CVD) process, or a physical vapor deposition (PVD) process.

Figure 1B:
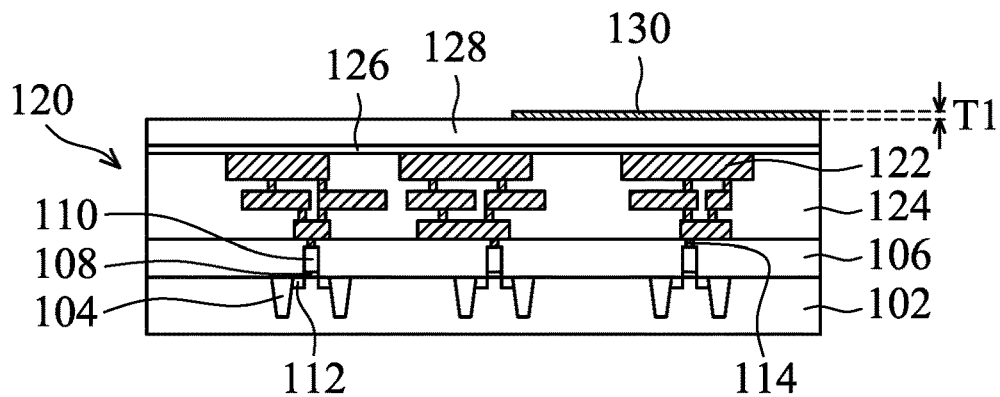

Afterwards, as shown in FIG. 1B, an etching stop layer 126 is formed over the interconnect structure 120, and a first dielectric layer 128 is formed over the etching stop layer 126, in accordance with some embodiments of the disclosure. Next, a first capacitor bottom metal (CBM) layer 130 is formed over the first dielectric layer 128.

The etching stop layer 126 is made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. The etching stop layer 126 is formed by a deposition process, such as chemical vapor deposition (CVD), physical vapor deposition (PVD), atomic layer deposition (ALD), or another applicable process.

The first capacitor bottom metal (CBM) layer 130 is made of conductive material, such as titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W) or tungsten (W) alloy or another applicable material. In some embodiments, the first CBM layer 130 has a first thickness $T_1$ in a range from about 200 angstrom to about 800 angstrom.

The first CBM layer 130 is formed by a procedure including depositing, photolithography, and etching processes. The deposition processes include chemical vapor deposition (CVD), physical vapor deposition (PVD), atomic layer deposition (ALD), or applicable process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

In some embodiments, after the photolithography processes, a cleaning process is performed to remove some residue remaining on the first CBM layer 130. In some embodiments, the cleaning process is performed by performing a $N_2O$ treatment on the first CBM layer 130.

Figure 1C:
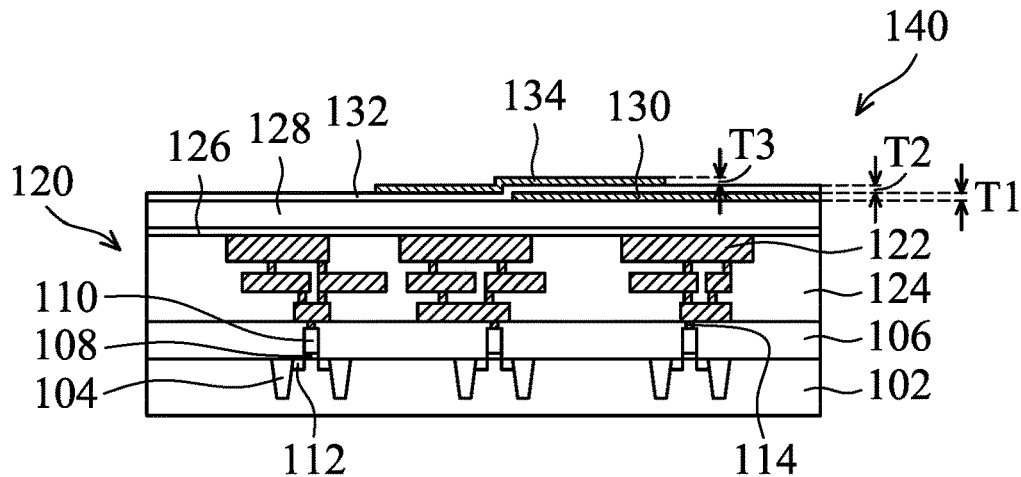

Next, as shown in FIG. 1C, a first insulating layer 132 is formed over the first CBM layer 130, and a first capacitor top metal (CTM) layer 134 is formed over the first insulating layer 132, in accordance with some embodiments of the disclosure. A first metal-insulator-metal (MIM) capacitor 140 is constructed by the first CBM layer 130, the first insulating layer 132 and the first CTM layer 134. The first CBM layer 130 is a bottom electrode of the first MIM capacitor 140, and the first CTM layer 134 is the top electrode of the first MIM capacitor 140.

In some embodiments, the first insulating layer 132 is made of high-k dielectric material. In some embodiments, the high-k dielectric material has a relative dielectric constant (the K value) in a range from 4 to about 100. In some embodiments, the high-k dielectric material is zirconium dioxide ($ZrO_2$), aluminum oxide ($Al_2O_3$), titanium oxide ($Ti_xO_y$, x is a real number and y is a real number), tantalum oxide ($Ta_xO_y$, x is a real number and y is a real number), titanium oxide nitride ($Ti_xO_yN_z$, x is a real number, y is a real number and z is a real number) or tantalum oxide nitride ($Ta_xO_yN_x$, x is a real number, y is a real number and z is a real number). In some embodiments, the first insulating layer 132 is a $ZrO_2$—$Al_2O_3$—$ZrO_2$ (ZAZ) laminate layer. In some embodiments, the first insulating layer 132 has a second thickness $T_2$ in a range from about 40 angstrom to about 200 angstrom.

The first capacitor top metal (CTM) layer 134 is made of conductive material, such as titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W) or tungsten (W) alloy or another applicable material. In some embodiments, the first CTM layer 134 has a third thickness $T_3$ in a range from about 200 angstrom to about 800 angstrom.

Figure 1D:
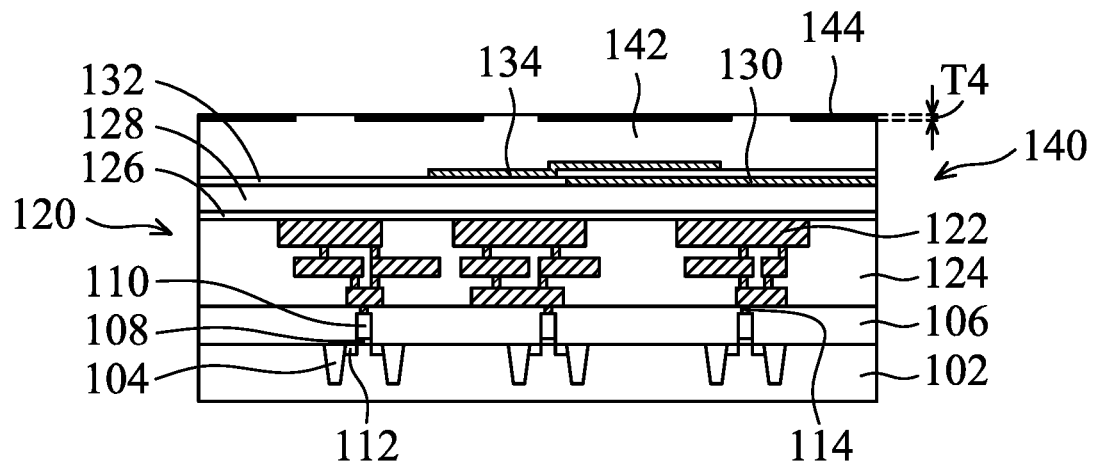

Afterwards, as shown in FIG. 1D, a second dielectric layer 142 is formed over the first capacitor 140, and a shielding layer 144 is formed in the second dielectric layer 142, in accordance with some embodiments of the disclosure.

The shielding layer 144 is used to as a barrier layer or a crack-stop layer to prevent cracks from expanding into the first MIM capacitor 140. In some embodiments, cracks form in the passivation layer 158 (shown in FIG. 1G), and then the cracks penetrate into the fourth dielectric layer 154 (shown in FIG. 1G) or the third dielectric layer 146 (shown in FIG. 1E). The shielding layer 144 exhibits the properties of ductility and malleability since it is made of a conductive material. Cracks may stop forming in the shielding layer 144 due to its properties of ductility and malleability. In addition, the cracks will not penetrate into the MIM capacitor 140. Therefore, the embedded first MIM capacitor 140 is not damaged by the cracks.

The shielding layer 144 is made of conductive material. In some embodiments, the shielding layer 144 is made of metal. In some embodiments, the shielding layer 144 is gold (Au), gold alloy, silver (Ag), silver alloy, copper (Cu), copper alloy, aluminum (Al), aluminum alloy, tungsten (W), tungsten alloy, titanium (Ti), titanium alloy, titanium nitride (TiN), tantalum (Ta), tantalum alloy, tantalum nitride (TaN), or another applicable material. In some embodiments, the shielding layer 144 has a fourth thickness T4 in a range from about 100 angstrom to about 5000 angstrom. In some embodiments, a ratio (T4/T3) of the fourth thickness $T_4$ of the shielding layer 144 to the third thickness $T_3$ of the first CTM layer 134 is in a range from about 0.25 to about 10.

Figure 1E:
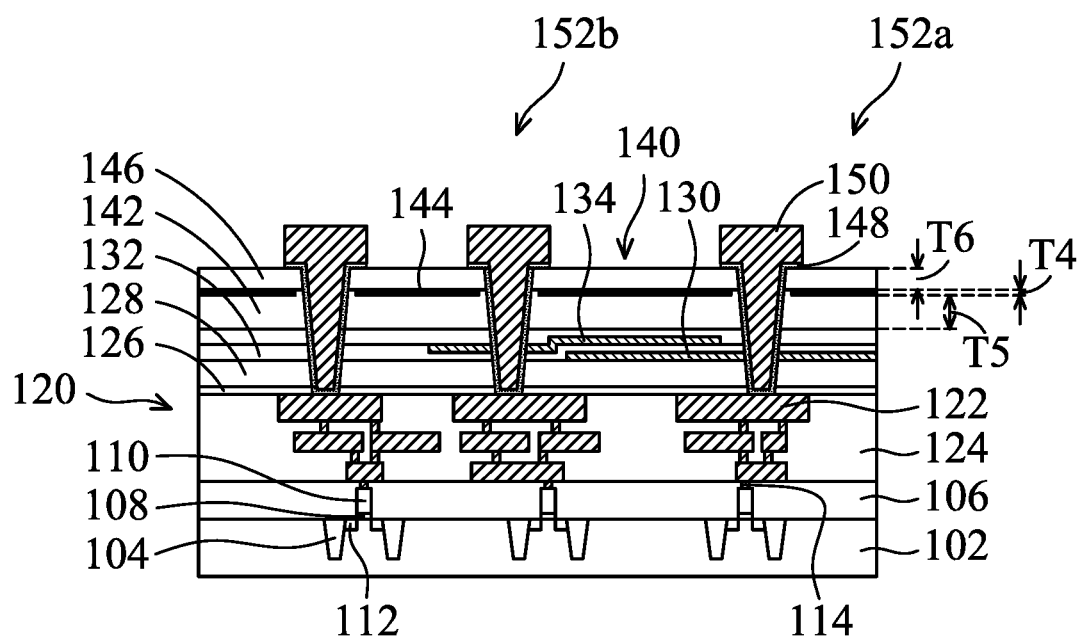

Afterwards, as shown in FIG. 1E, the third dielectric layer 146 is formed over the shielding layer 144, and a number of recesses (not shown) is formed through the third dielectric layer 146, the second dielectric layer 142, the first dielectric layer 128 and the etching stop layer 126, in accordance with some embodiments of the disclosure. Next, a barrier layer 148 and a conductive material 150 are sequentially formed in each of the recesses. As a result, a first through via 152a and a second through via 152b are formed.

It should be noted that the first through via 152a or the second through via 152b are insulated from the shielding layer 144. The shielding layer 144 is between the first through via 152a and the second through via 152b, but the shielding layer 144 is not in direct contact with the first through via 152a or the second through via 152b.

The first through via 152a and the second through via 152b are used to connect to the bottom electrode or the top electrode of the first MIM capacitor 140 to provide different voltage. In some embodiments, the first through via 152a is connected to the first capacitor bottom metal (CBM) layer 130, and the second through via 152b is connected to the first capacitor top metal (CTM) layer 134. More specifically, the barrier layer 148 has a ring shape when seen from the top-view, the barrier layer 148 of the first through via 152a is in direct contact with the first CBM layer 130, and the barrier layer 148 of the second through via 152a is in direct contact with the first CTM layer 134.

As shown in FIG. 1E, the first CTM layer 134 has a first horizontal portion, a vertical portion and a second horizontal portion. The vertical portion is between the first horizontal portion and the second horizontal portion. The first horizontal portion is higher than the second horizontal portion, and the second horizontal portion is in direct contact with the second through via 152b. More specifically, the second horizontal portion of the first CTM layer 134 is in direct contact with the barrier layer 148 of the second through via 152b.

The second dielectric layer 142 has a fifth thickness $T_5$, and the third dielectric layer 146 has a sixth thickness $T_6$. In some embodiments, the fifth thickness $T_5$ of the second dielectric layer is in a range from about 0.5 angstrom to about 5000 angstrom. In some embodiments, the sixth thickness $T_6$ of the third dielectric layer 146 is in a range from about 0.2 angstrom to about 2000 angstrom.

Figure 1F:
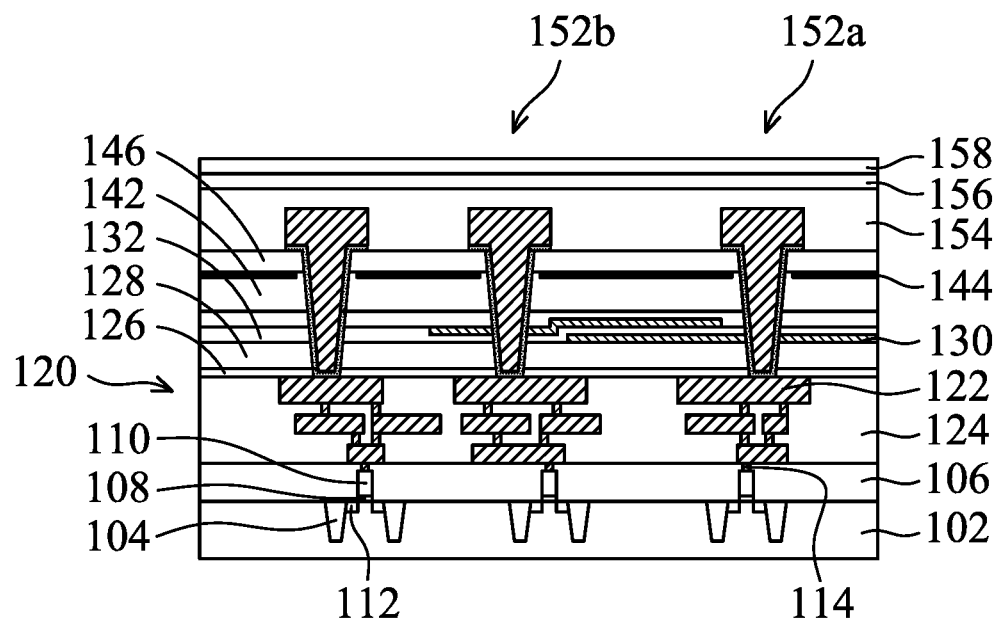

Afterwards, as shown in FIG. 1F, the fourth dielectric layer 154 is formed over the first through via 152a and the second through via 152b, and an etching stop layer 156 is formed over the fourth dielectric layer 154, in accordance with some embodiments of the disclosure.

Figure 1G:
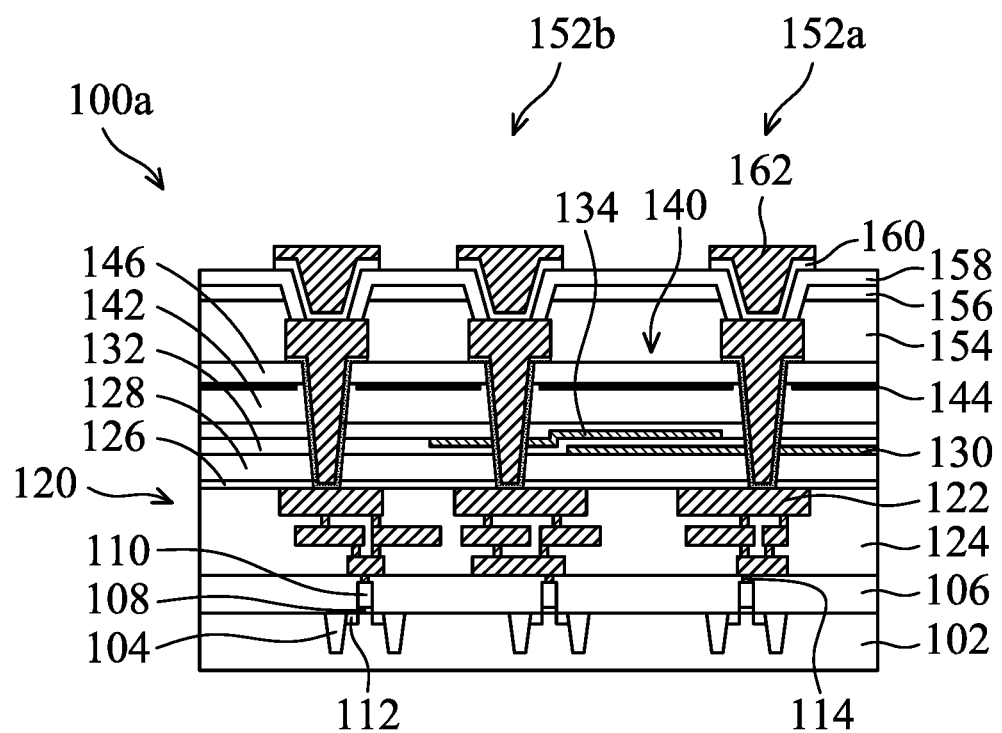

Next, as shown in FIG. 1G, a number of openings (not shown) are formed through the fourth dielectric layer 154 and the etching stop layer 156, and then the passivation layer 158 is formed on sidewalls of the openings, in accordance with some embodiments of the disclosure. Next, an under bump metallurgy (UBM) layer 160 is formed in the openings and over the passivation layer 158, and a connector 162 is formed over the UBM layer 160. As a result, a die structure 100a is formed.

The UBM layer 160 is directly over the first through via 152a and the second through via 152b. The connector 162 is electrically connected to the first through via 152a or the second through via 152b by the UBM layer 160. The connector 162 is electrically connected to the conductive layer 122 by the first through via 152a or the second through via 152b. The connector 162 overlaps a portion of the first through via 152a or a portion of the second through via 152b.

The UBM layer 160 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 160 may contain an adhesion layer and/or a wetting layer. In some embodiments, the UBM layer 160 further includes a copper seed layer. In some embodiments, the UBM layer 160 includes an adhesion layer made of Ti/Cu and a wetting layer made of Cu. In some embodiments, the UBM layer 160 is formed by a plating process, such as an electrochemical plating process or an electroless process.

In some embodiments, the connector 162 is made of a metal layer, such as copper, copper alloy, nickel, nickel alloy, aluminum, aluminum alloy, tin, tin alloy, lead, lead alloy, silver, silver alloy or a combination thereof. In some embodiments, the connector 162 is formed by a plating process, such as an electrochemical plating process or an electroless process.

Figure 1H:
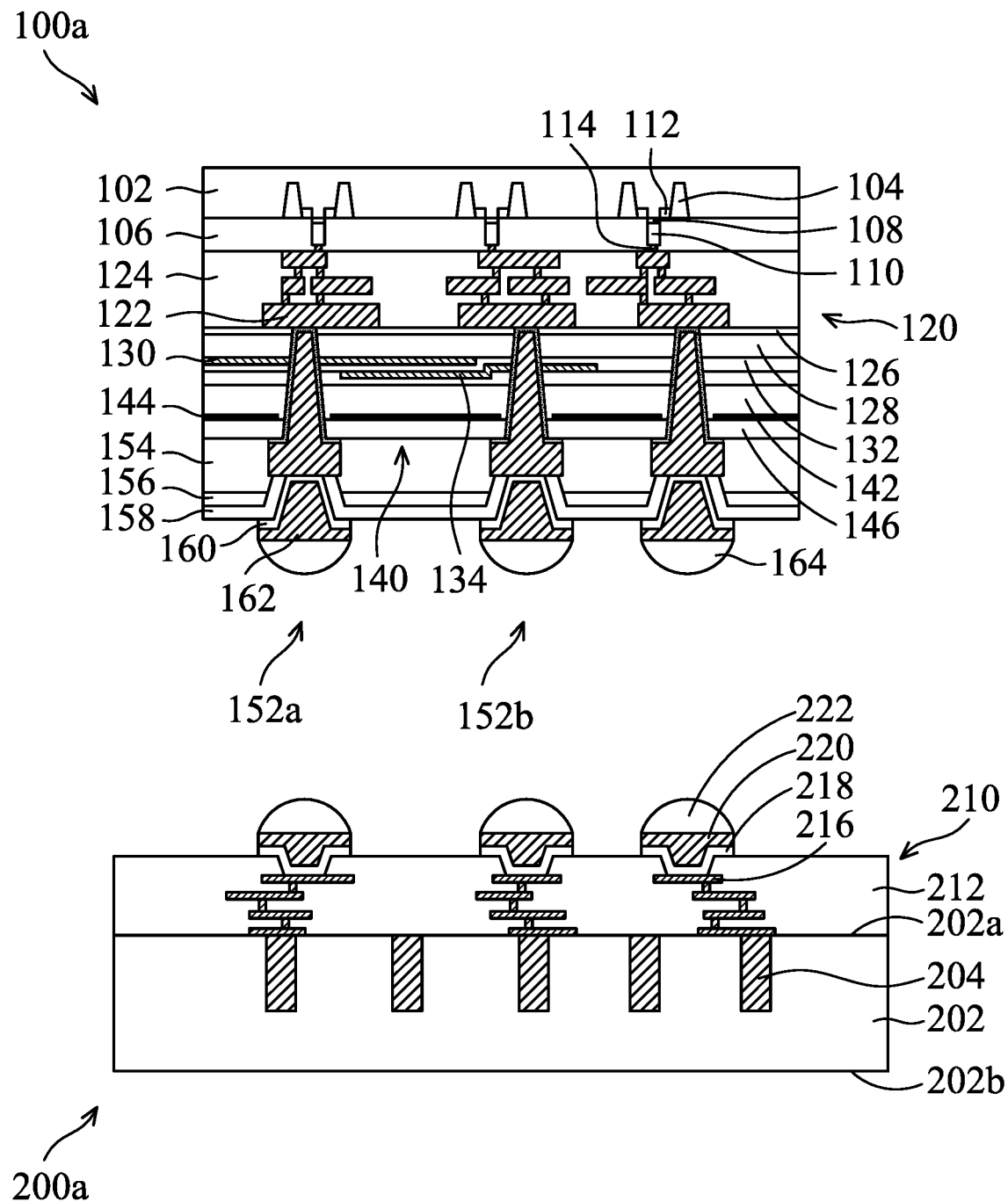

Subsequently, as shown in FIG. 1H, the die structure 100a is turned upside down, and an interposer structure 200a is prepared to face the connector 162 of the die structure 100a, in accordance with some embodiments of the disclosure.

The interposer structure 200a includes a second substrate 202, and a number of conductive structures 204 formed in the second substrate 202. The conductive structures 204 extend from the front surface 202a of the second substrate 202 towards the back surface 202b of the second substrate 202. In some embodiments, the conductive structures 204 are formed by forming a number of trenches (not shown) which extend from the front surface 202a of the second substrate 202. Afterwards, a barrier layer (not shown) is filled into each of the trenches, and the conductive structure 204 is formed on the barrier layer (not shown) and in each of the trenches.

An interconnect structure 210 is formed over the second substrate 202. The interconnect structure 210 may be used as a redistribution (RDL) structure for routing. The interconnect structure 210 includes multiple conductive layers 216 formed in multiple dielectric layers 212. An UBM layer 218 is formed over the conductive layer 216, and a connector 220 is formed over the UBM layer 218. Before the die structure 100a is bonded to the interposer structure 200a, a solder material 222 is formed over the connector 220, and a solder material 164 is formed over the connector 162.

Figure 1I:
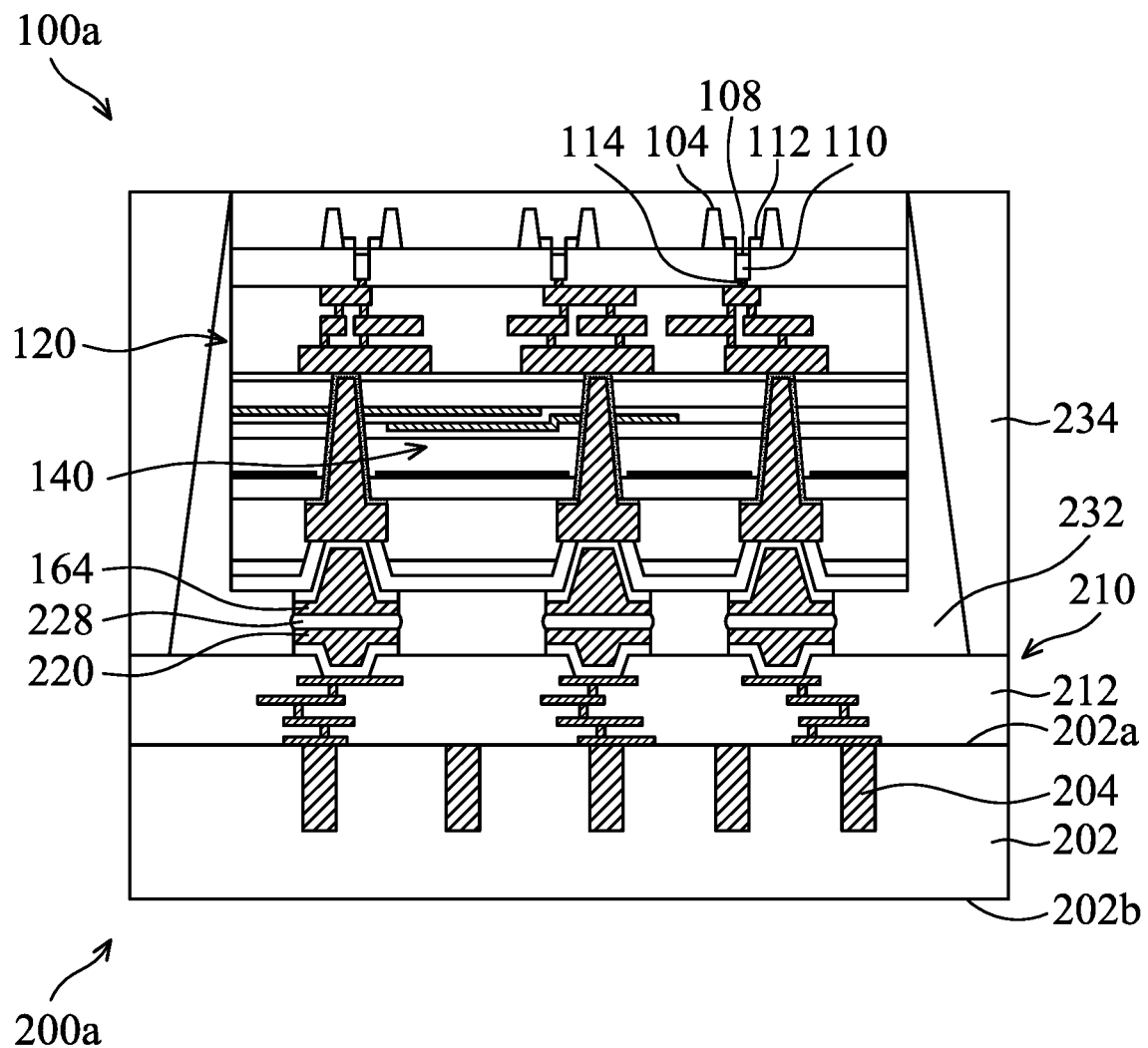

Next, as shown in FIG. 1I, the die structure 100a is bonded to the interposer structure 200a by bonding the connector 220 and the connector 162, in accordance with some embodiments of the disclosure. As a result, a bonding connector 228 is formed between the connector 220 and the connector 162. Next, a underfill layer 232 is formed between the die structure 100a and the interconnect structure 210. The underfill layer 232 surrounds and protects the connectors 220, 162. In some embodiments, the underfill layer 130 is in direct contact with the connectors 220, 162. Afterwards, a package layer 234 is formed over the underfill layer 232. The package layer 234 surrounds and protects the die structure 100a.

The bonding connector 228 is made of solder materials, such as tin (Sn), tin-silver (SnAg), tin-lead (SnPb), tin-copper (SnCu), tin-silver-copper (SnAgCu), tin-silver-zinc (SnAgZn), tin-zinc (SnZn), tin-bismuth-indium (SnBiIn), tin-indium (SnIn), tin-gold (SnAu), tin-zinc-indium (SnZnIn), tin-silver-Antimony (SnAgSb) or another applicable material.

In some embodiments, the underfill layer 232 is made of or includes a polymer material. The underfill layer 232 may include an epoxy-based resin. In some embodiments, the underfill layer 232 includes fillers dispersed in the epoxy-based resin. In some embodiments, the formation of the underfill layer 232 involves an injecting process, a spin-on process, a dispensing process, a film lamination process, an application process, one or more other applicable processes, or a combination thereof. In some embodiments, a thermal curing process is used during the formation of the underfill layer 130.

The package layer 234 is made of a molding compound material. The molding compound material may include a polymer material, such as an epoxy-based resin with fillers dispersed therein. In some embodiments, a liquid molding compound material is applied over the die structure 100a. A thermal process is then used to cure the liquid molding compound material and to transform it into the package layer 234.

Figure 1J:
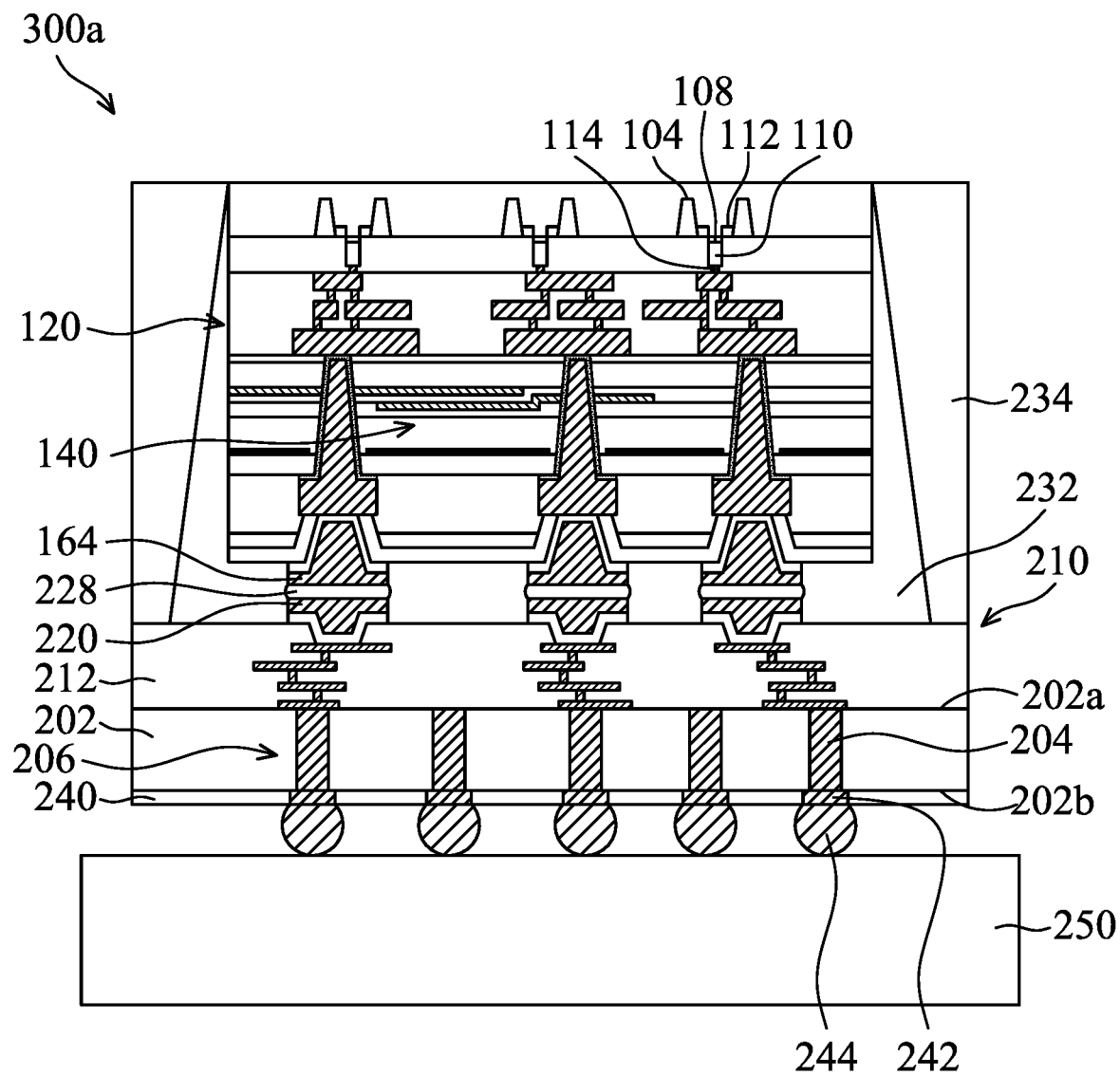

Next, as shown in FIG. 1J, the substrate 202 is thinned from the back surface 202b of the second substrate 202 until the conductive structures 204 are exposed, in accordance with some embodiments of the disclosure. In some embodiments, the conductive structures 204 become exposed and penetrate through the thinned substrate 202. As a result, a through via structure 206 is formed in the substrate 102. In some embodiments, the through via structure 206 is a through substrate via (TSV) structure. In some other embodiments, the through via structure 206 may be referred to as a through-silicon via.

Next, a dielectric layer 240 is formed below the substrate 202, and a conductive pad 242 is formed in the dielectric layer 240. The connector 244 is formed below the conductive pad 242. The interposer structure 200a is bonded to a package substrate 250 by the connector 244 to form the package structure 300a.

In some embodiments, the package substrate 250 is a printed circuit board (PCB), a ceramic substrate or another suitable package substrate. The interconnect structure 210 is used as fan out electrical connection to connect the signals of the die structure 100a to the package substrate 250.

The first MIM capacitor 140 is formed over the top metal layer 122 of the interconnect structure 120. The first MIM capacitor 140, the first through via 152a and the second through via 152b are formed after the interconnect structure 120 is formed. Since the first through via 152a and the second through via 152b are formed after the interconnect structure 120 is formed, the first through via 152a and the second through via 152b have a larger size or larger area (large width and large depth in a cross-sectional view) than a via formed in the interconnect structure 120. The contact resistance between the first MIM capacitor 140 and the first through via 152a is reduced due to the large size of the first through via 152a. Unlike when a MIM capacitor is formed in one layer of the interconnect structure 120, the contact resistance between the first MIM capacitor 140 and the first through via 152a is lower than the contact resistance between the MIM capacitor and the via which is formed in the interconnect structure 120.

The die structure 100a and the package substrate 250 have different coefficients of thermal expansion (CTE), and cracks are formed due to the CTE mismatch. In some embodiments, the cracks are generated in the passivation layer 158 (shown in FIG. 1G), and then the cracks penetrate the fourth dielectric layer 154 (shown in FIG. 1G) or the third dielectric layer 146 (as shown in FIG. 1E). If no shielding layer 144 is formed over the first MIM capacitor 140, the cracks may penetrate into the layers in the first MIM capacitor 140 and the layers of the first MIM capacitor 140 may be delaminated. In order to stop the expansion of the cracks, the shielding layer 144 is formed between the fourth dielectric layer 154 and the first MIM capacitor 140. Therefore, the embedded first MIM capacitor 140 is not damaged by the cracks, and the quality, yield, and reliability of the package structure are improved.

FIGS. 2A-2D show top-view representations of the die structure 100a, in accordance with some embodiments of the disclosure. FIG. 1G shows a cross-sectional representation of the die structure 100a taken along line A-A' of FIGS. 2A-2D.

The die structure 100a includes a central region 11 and an edge region 12 in which the shielding layer 144 is distributed. The edge region 12 is outside of the central region 11.

Since cracks may form in the edge region 12 of the die structure 100a, the shielding layer 144 is distributed in the edge region 12. In some embodiments, the central region 11 has an octagonal shape (as shown in FIGS. 2A and 2D), a cross shape (shown in FIG. 2B), a rectangular shape (as shown in FIG. 2C) or another shape.

The die structure 100a has a first width $W_1$ and a first length $L_1$. As shown in FIG. 2A, the edge region 12 has a triangular shape when seen from a top-view and has a second width $W_2$ and a second length $L_2$. In some embodiments, there is a ratio ($W_2/W_1$) of the second width $W_2$ to the first width $W_1$ is in a range from about 0.01 to about 0.25. In some embodiments, there is a ratio ($L_2/L_1$) of the second length $L_2$ to the first length $L_1$ is in a range from about 0.01 to about 0.25. In some embodiments, there is a distance $S_1$ between the outmost sidewall of the central region 11 and the outermost sidewall of the edge region 12, and a ratio ($S_1/W_1$) of the distance $S_1$ to the first width $W_1$ is in a range from about 0.0005 to about 0.01.

As shown in FIG. 2C, the central region 11 has a first side 11a and a second side 11b parallel to the direction of the first length $L_1$. There is a second width $W_2$ between the first side 11a and the outer edge of the edge region 12. There is a third width $W_3$ between the second side 11b and the outer edge of the edge region 12. In some embodiments, the second width $W_2$ is equal to or greater than the third width $W_3$.

In addition, the central region 11 has a third side 11c and a fourth side 11d parallel to the direction of the first width $W_1$. There is a second length $L_2$ between the third side 11c of the central region 11 and the outer edge of the edge region 12. There is a third length $L_3$ between the fourth side 11d and the outer edge of the edge region 12. In some embodiments, the second length $L_2$ is equal to or greater than the third length $L_3$.

FIGS. 3A-3E show cross-sectional representations of various stages of forming a package structure 300b, in accordance with some embodiments of the disclosure. Some processes and materials used to form the package structure 300b are similar to, or the same as, those used to form package structure 300a and are not repeated herein.

Figure 3A:
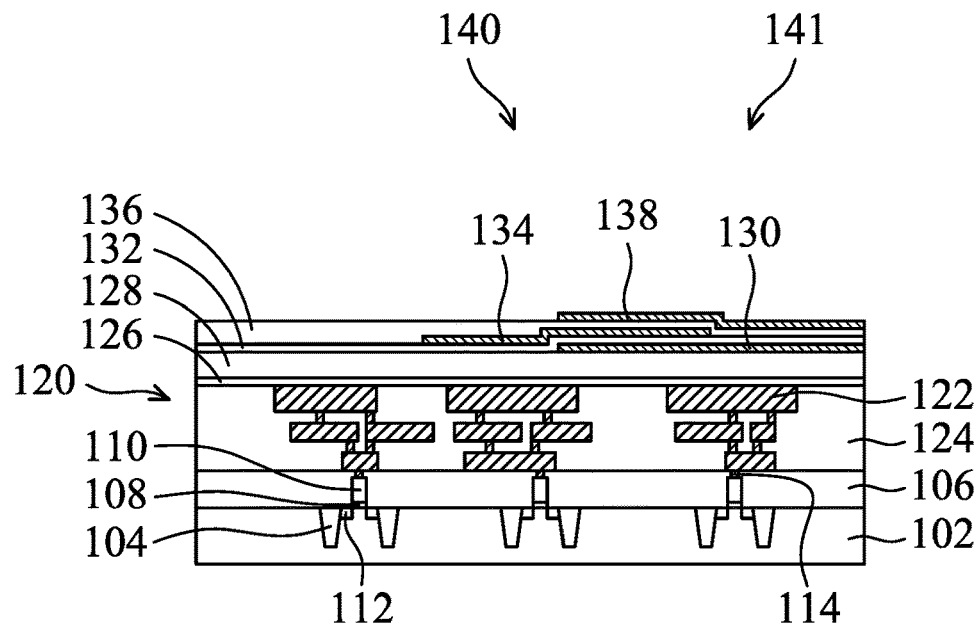
FIGS. 3A-3E show cross-sectional representations of various stages of forming a package structure, in accordance with some embodiments of the disclosure.

As shown in FIG. 3A, a second insulating layer 136 is formed over the first CTM layer 134, and a second CTM layer 138 is formed over the second insulating layer 136. The first metal-insulator-metal (MIM) capacitor 140 is constructed by the first CBM layer 130, the first insulating layer 132 and the first CTM layer 134. A second MIM capacitor 141 is constructed by the first CTM layer 134, the second insulating layer 136 and the second CTM layer 138. The second MIM capacitor 141 is formed over the first MIM capacitor 140.

Figure 3B:
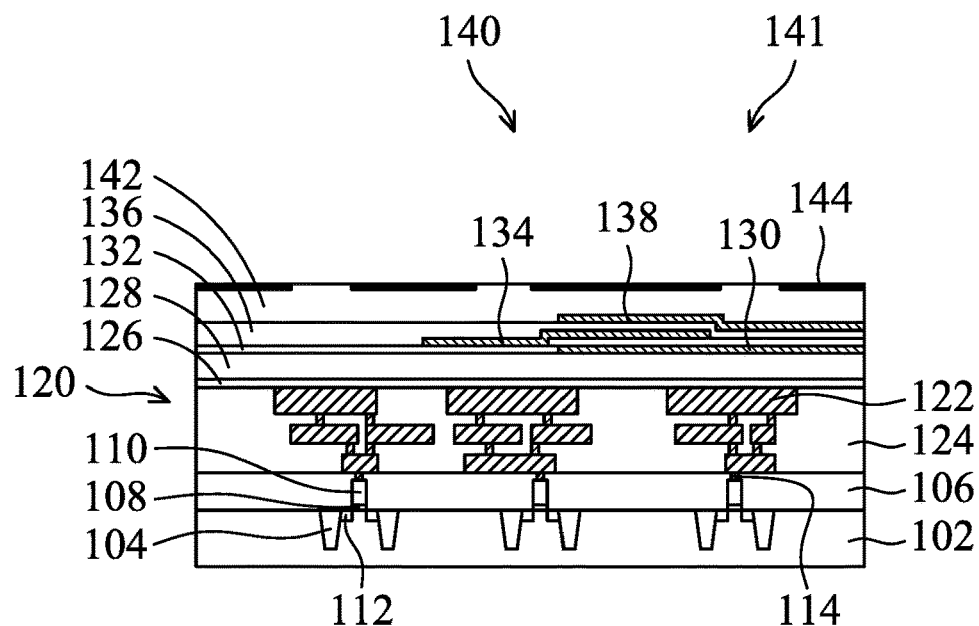

Next, as shown in FIG. 3B, the second dielectric layer 142 is formed over the first capacitor 140, and the shielding layer 144 is formed in the second dielectric layer 142, in accordance with some embodiments of the disclosure. The shielding layer 144 is used to as a barrier layer or a crack-stop layer to prevent cracks from expanding into the first MIM capacitor 140.

Figure 3C:
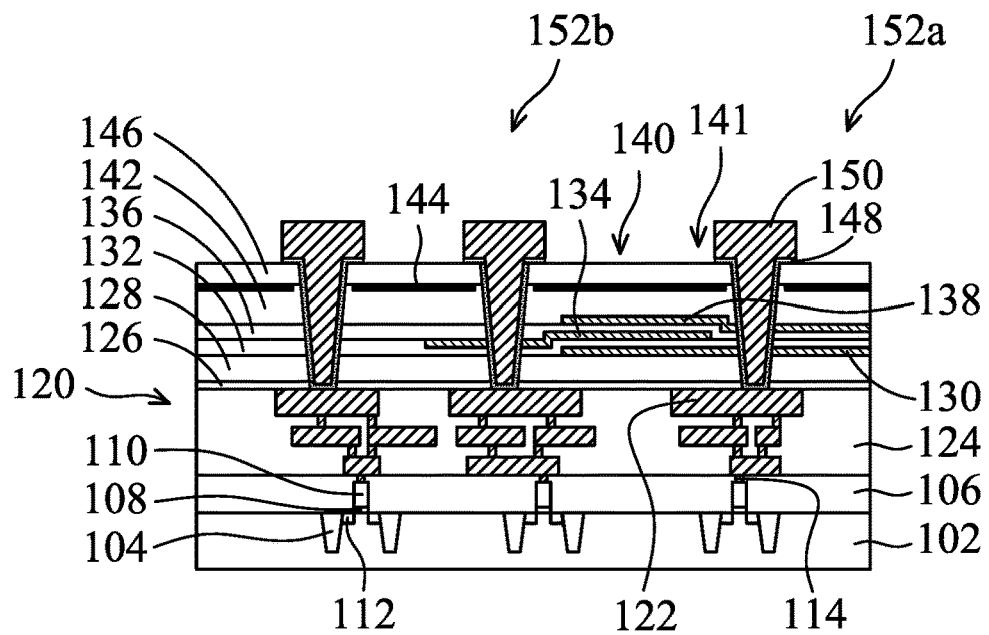

Next, as shown in FIG. 3C, the third dielectric layer 146 is formed over the shielding layer 144, and a number of recesses (not shown) is formed through the third dielectric layer 146, the second dielectric layer 142, the first dielectric layer 128 and the etching stop layer 126, in accordance with some embodiments of the disclosure.

Next, the barrier layer 148 and the conductive material 150 are sequentially formed in each of the recesses. As a result, a first through via 152a and a second through via 152b are formed.

It should be noted that the first through via 152a or the second through via 152b are insulated from the shielding layer 144. The shielding layer 144 is between the first through via 152a and the second through via 152b, but the shielding layer 144 is not in direct contact with the first through via 152a or the second through via 152b. The first through via 152a is connected to the first CBM layer 130 and the second CTM layer 138. The second through via 152b is connected to the first CTM layer 134.

As shown in FIG. 3C, the second CTM layer 138 has a first horizontal portion, a vertical portion and a second horizontal portion. The vertical portion is between the first horizontal portion and the second horizontal portion. The first horizontal portion is higher than the second horizontal portion, and the second horizontal portion is in direct contact with the first through via 152a.

Figure 3D:
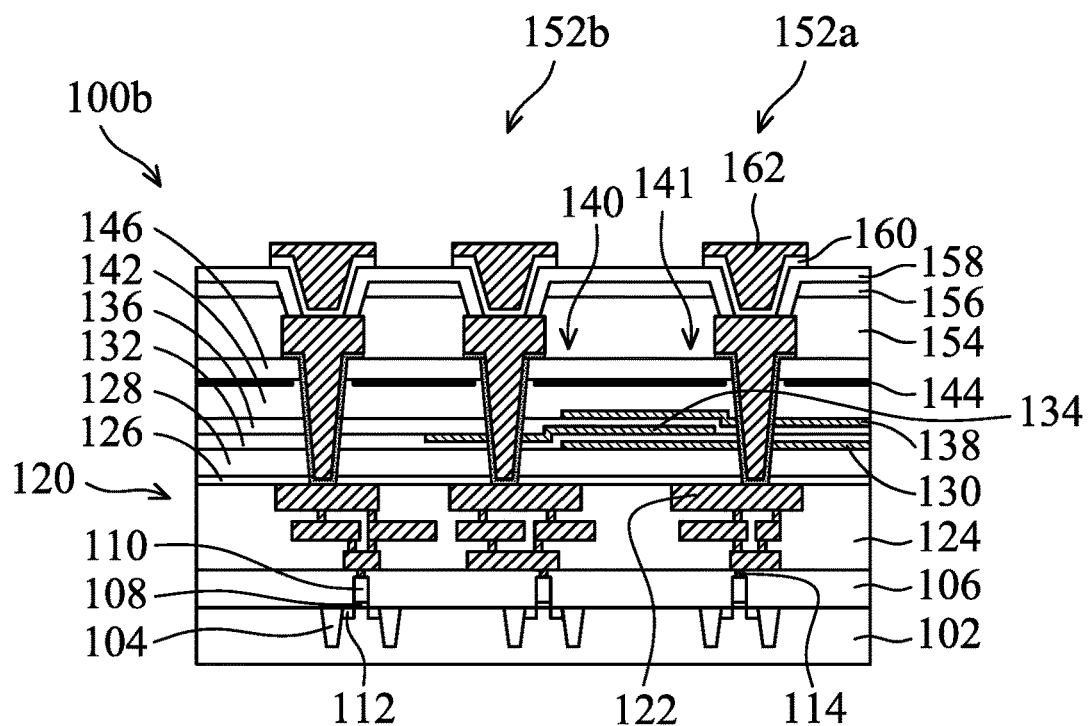

Subsequently, as shown in FIG. 3D, the fourth dielectric layer 154 and the etching stop layer 156 are formed over the shielding layer 144, in accordance with some embodiments of the disclosure. Next, a number of openings (not shown) are formed through the fourth dielectric layer 154 and the etching stop layer 156, and then the passivation layer 158 is formed in the openings. Next, the UBM layer 160 is formed in the openings and over the passivation layer 158, and the connector 162 is formed over the UBM layer 160. As a result, a die structure 100b is formed.

Figure 3E:
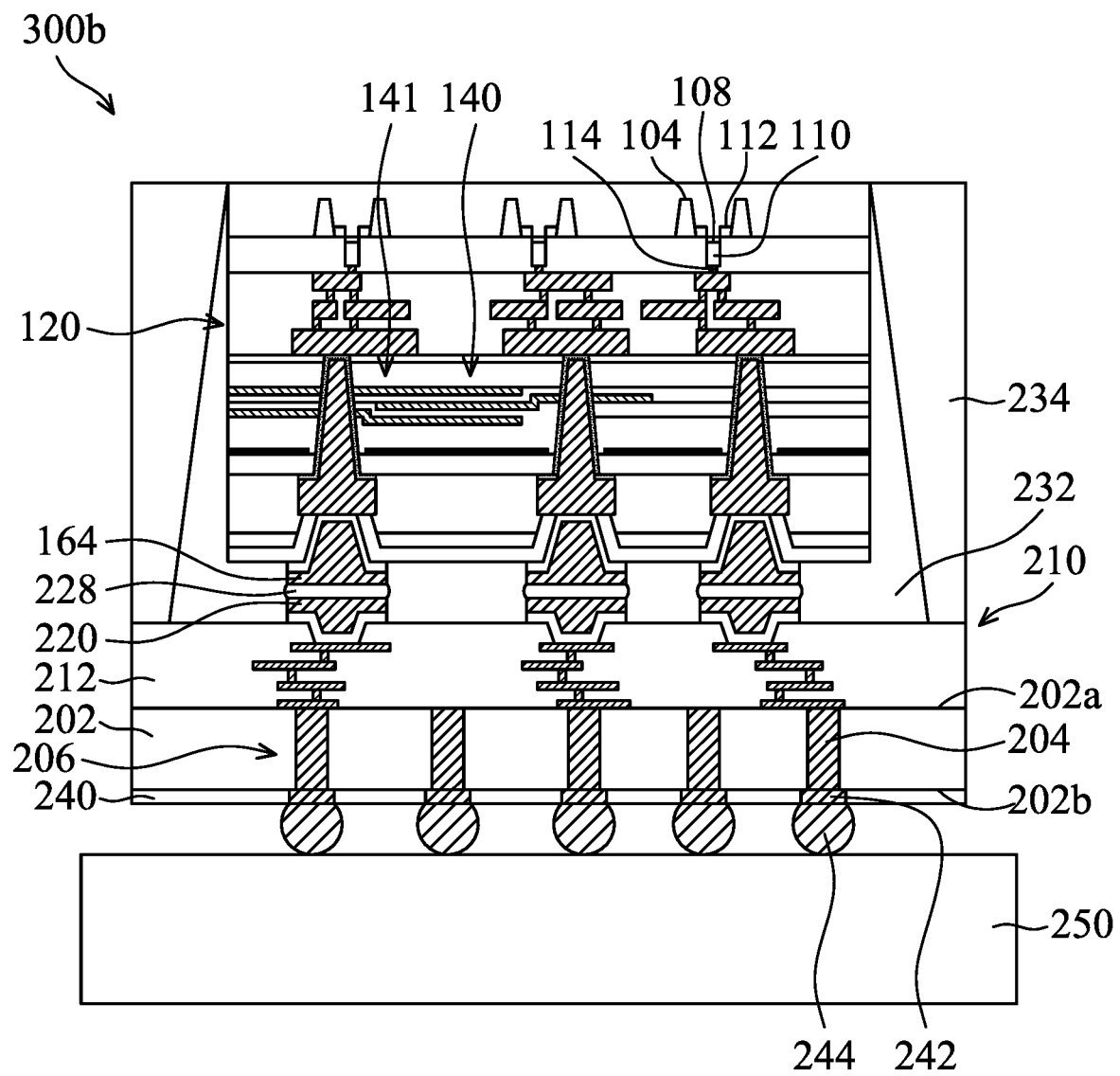

Afterwards, as shown in FIG. 3E, the die structure 100b is bonded to the interposer substrate 200a, and the underfill layer 232 is formed between the die structure 100b and the interconnect structure 210. Next, the package layer 234 is formed over the underfill layer 232. Next, the interposer structure 200a is bonded to a package substrate 250 by the connector 244 to form the package structure 300b.

Figure 4A:
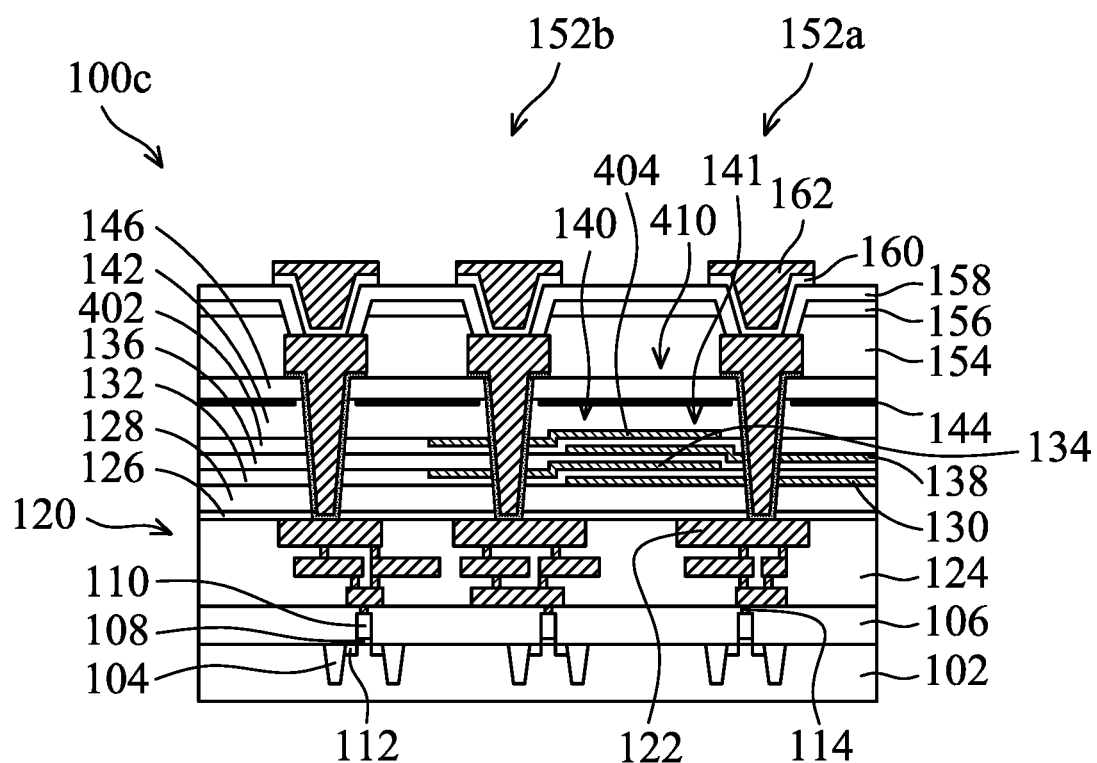
FIGS. 4A-4B show cross-sectional representations of various stages of forming a package structure, in accordance with some embodiments of the disclosure.
Figure 4B:
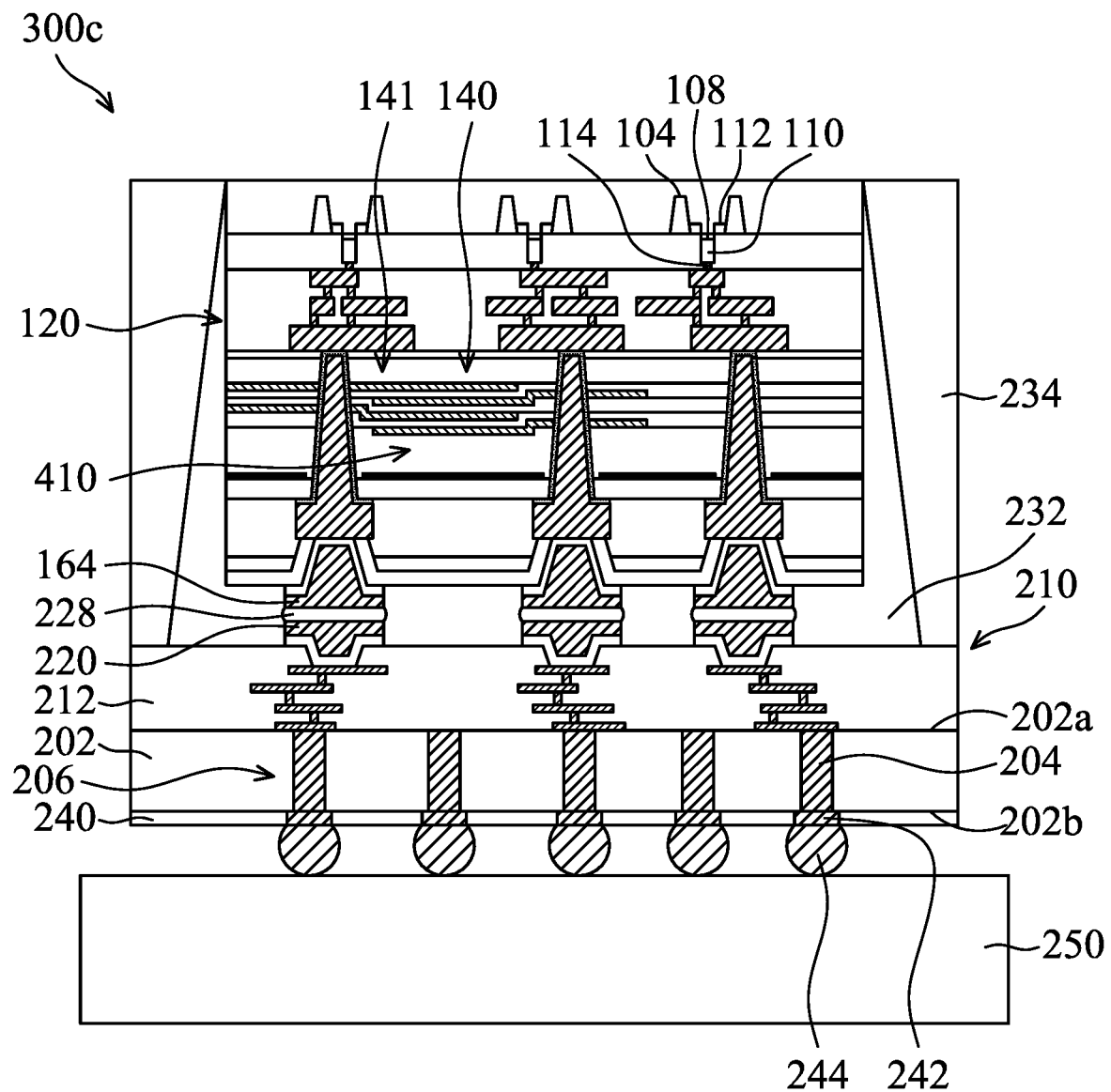

FIGS. 4A-4B show cross-sectional representations of various stages of forming a package structure 300c, in accordance with some embodiments of the disclosure. Some processes and materials used to form the die structure 100c are similar to, or the same as, those used to form the die structure 100a and are not repeated herein.

As shown in FIG. 4A, a third insulating layer 402 is formed over the second CTM layer 138, and a third CTM layer 404 is formed over the third insulating layer 402. A third MIM capacitor 410 is formed over the second MIM capacitor 141. The third CTM layer 404 has a stair shape.

The first through via 152a is connected to the first CBM layer 130 and the second CTN layer 138, and the second through via 152b is connected to the first CTM layer 134 and the third CTM layer 404. It should be noted that, because a shielding layer 144 is formed between the third MIM capacitor 410 and the third dielectric layer 146, cracks will not penetrate the first MIM capacitor 140, the second MIM capacitor 141 or the third MIM capacitor 410. The shielding layer 144 protects the first MIM capacitor 140 and the second MIM capacitor 141 from being damaged.

As shown in FIG. 4B, a die structure 100c is boned to the interposer structure 200a. The interposer structure 200a is bonded to the package substrate 250 by the connector 244 to form the package structure 300c.

In some embodiments, more than three MIM capacitors are formed between the interconnect structure 120 and the shielding layer 144. Each of the MIM capacitors has a bottom electrode (e.g. first CBM layer 130) and a top electrode (e.g. first CTM layer 134), and the bottom electrode and the top electrode are connected to two different through vias. Therefore, two different voltages can be provided to the top electrode and the bottom electrode of the MIM capacitor.

The package structure 300a or 300b includes the interconnect structure 120 formed over the substrate 102, the embedded first MIM capacitor 140 and the second MIM capacitor 141 formed in the dielectric layer, and the connector 162 formed over the first MIM capacitor 140 and the second MIM capacitor 141. Since cracks may form in the passivation layer 158 or the fourth dielectric layer 154 due to the CTE mismatch of the die structure 100a and the package substrate 250, the shielding layer 144 provides a crack-stop function to prevent the embedded first MIM capacitor 140 and the second MIM capacitor 141 from being damaged.

Embodiments for forming a package structure and method for formation of the same are provided. The package structure includes a top metal layer over a substrate, and a MIM capacitor formed over the top metal layer. A shielding layer is formed over the MIM capacitor, and a through via passes through the MIM capacitor. A connector is formed over the through via. The shielding layer is between the MIM capacitor and the connector. The shielding layer is used as a crack-stop layer to prevent cracks from expanding or penetrating into the MIM capacitor. The MIM capacitor is protected by the shielding layer, and the cracks are reduced or prevented. Therefore, the quality, yield, and reliability of the package structure are improved.

In some embodiments, a package structure is provided. The package structure includes a conductive layer formed over a first substrate, and a dielectric layer formed over the conductive layer. The package structure includes a metal-insulator-metal (MIM) capacitor embedded in the dielectric layer, and a shielding layer formed over the MIM capacitor. The shielding layer is insulated from the MIM capacitor by the dielectric layer. The package structure also includes a first through via formed through the MIM capacitor, and the first through via is connected to the conductive layer, and the first through via is insulated from the shielding layer.

In some embodiments, a package structure is provided. The package structure includes a first capacitor bottom metal (CBM) layer formed over a first substrate, and a first insulating layer formed over the first CBM layer. The package structure includes a first capacitor top metal (CTM) layer formed over the first insulating layer, and a MIM capacitor is constructed by the first CBM layer, the first insulating layer and the first CTM layer. The package structure further includes a conductive shielding layer formed over the first CTM layer, and the conductive shielding layer is insulated from the first CTM layer. The package structure further includes a first through via through the MIM capacitor, and the first through via is connected to the first CBM layer. The package structure includes a second through via through the MIM capacitor, and the second through via is connected to the first CTM layer.

In some embodiments, a method for forming a package structure is provided. The method includes forming a first capacitor bottom metal (CBM) layer over a substrate, and forming a first insulating layer over the first CBM layer. The method also includes forming a first capacitor top metal (CTM) layer over the first insulating layer, and a MIM capacitor is constructed by the first CBM layer, the first insulating layer and the first CTM layer. The method further includes forming a shielding layer over the MIM capacitor, and the shielding layer is insulated from the first CTM layer. The method includes forming a first through via through the MIM capacitor, and the first through via is connected to the first CBM layer. The method includes forming a second through via through the first CTM layer, wherein the second through via is connected to the first CTM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A package structure, comprising:
   a gate structure formed over a first substrate;
   a conductive layer formed over the gate structure;
   a dielectric layer formed over the conductive layer;
   a metal-insulator-metal (MIM) capacitor embedded in the dielectric layer;
   a shielding layer formed over the MIM capacitor, wherein the shielding layer is insulated from the MIM capacitor by the dielectric layer; and
   a first through via formed through the MIM capacitor, wherein the first through via is connected to the conductive layer, and the first through via is insulated from the shielding layer, and a sidewall of the shielding layer extends beyond a sidewall of the gate structure, wherein the shielding layer is lower than a topmost surface of the first through via.

2. The package structure as claimed in claim 1, wherein the metal-insulator-metal (MIM) capacitor comprises:
   a first capacitor bottom metal (CBM) layer;
   a first insulating layer formed over the first CBM layer; and
   a first capacitor top metal (CTM) layer formed over the first insulating layer, wherein the first CBM layer is connected to the first through via.

3. The package structure as claimed in claim 2, further comprising:
   a second through via formed adjacent to the first through via, wherein the second through via is connected to the first CTM layer.

4. The package structure as claimed in claim 2, further comprising:
   a second insulating layer formed over the first CTM layer; and
   a second CTM layer formed over the second insulating layer, wherein the second CTM layer is connected to the first through via.

5. The package structure as claimed in claim 2, wherein the first through via comprises a barrier layer and a conductive material, the conductive material is surrounded by the barrier layer, and the barrier layer is in direct contact with the first CBM layer of the MIM capacitor.

6. The package structure as claimed in claim 1, further comprising:
   an under bump metallization (UBM) layer formed over the first through via; and
   a connector formed over the UBM layer, wherein the connector is electrically connected to the conductive layer through the first through via.

7. The package structure as claimed in claim 1, wherein the shielding layer is not in direct contact with the first through via.

8. The package structure as claimed in claim 1, wherein the substrate includes a central region and an edge region, the shielding layer is distributed in the edge region, and the central region has an octagonal shape, a cross shape or a rectangular shape.

9. A package structure, comprising:
   a first capacitor bottom metal (CBM) layer formed over a first substrate;
   a first insulating layer formed over the first CBM layer;
   a first capacitor top metal (CTM) layer formed over the first insulating layer, wherein a metal-insulator-metal (MIM) capacitor is constructed by the first CBM layer, the first insulating layer and the first CTM layer;
   a conductive shielding layer formed over the first CTM layer, wherein the conductive shielding layer is insulated from the first CTM layer;
   a first through via through the MIM capacitor, wherein the first through via is connected to the first CBM layer;
   a second through via through the MIM capacitor, wherein the second through via is connected to the first CTM layer; and
   an underfill layer surrounding the MIM capacitor, wherein the underfill layer is in direct contact with the shielding layer.

10. The package structure as claimed in claim 9, further comprising:
    a transistor formed over the substrate; and
    an interconnect structure formed over the transistor, wherein the interconnect structure comprises a first top metal layer and a second top metal layer, the first through via is connected to the first top metal layer, the second through via is connected to the second top metal layer, and the first top metal layer and the second top metal layer are in the same level.

11. The package structure as claimed in claim 9, further comprising:
    a second insulating layer formed over the first CTM layer; and
    a second CTM layer formed over the second insulating layer, wherein the second CTM layer is connected to the first through via.

12. The package structure as claimed in claim 9, wherein the first CTM layer has a first horizontal portion, a vertical portion and a second horizontal portion, and the vertical portion is between the first horizontal portion and the second horizontal portion, the first horizontal portion is higher than the second horizontal portion, and the second horizontal portion is in direct contact with the second through via.

13. The package structure as claimed in claim 9, wherein the first through via comprises a barrier layer and a conductive material, the conductive material is surrounded by the barrier layer, and the barrier layer is in direct contact with the first CTM layer.

14. The package structure as claimed in claim 9, further comprising:
    an under bump metallization (UBM) layer formed over the first through via; and
    a connector formed over the UBM layer, wherein the connector is electrically connected to the first through via through the UBM layer.

15. The package structure as claimed in claim 9, wherein the conductive shielding layer is between the first through via and the second through via, and the conductive shielding layer is not in direct contact with the first through via or the second through via.

16. The package structure as claimed in claim 9, further comprising:

an interposer substrate formed over the MIM capacitor, wherein the interposer substrate comprises a number of through via structures formed in a second substrate; and a third substrate formed over the interposer structure.

17. A package structure, comprising:

a first capacitor bottom metal (CBM) layer formed over a first substrate;

a first insulating layer formed over the first CBM layer, wherein the first insulating layer comprises a first portion and a second portion, and the first portion is higher than the second portion;

a first capacitor top metal (CTM) layer formed over the first insulating layer, wherein a metal-insulator-metal (MIM) capacitor is constructed by the first CBM layer, the first insulating layer and the first CTM layer;

a first through via through the MIM capacitor, wherein the first through via is in direct contact with the first CBM layer and the first portion of the first insulating layer;

a second through via through the MIM capacitor, wherein the second through via is in direct contact with the first CTM layer and the second portion of the first insulating layer;

a shielding layer formed over the MIM capacitor, wherein the shielding layer is between the first through via and the second through via;

wherein the shielding layer has a plurality of discrete portions and one of the discrete portions of the shielding layer extends beyond the first through via; and a package layer surrounding the MIM capacitor and the shielding layer.

18. The package structure as claimed in claim 17, wherein the substrate includes a central region and an edge region, the shielding layer is distributed in the edge region, and the central region has an octagonal shape, a cross shape or a rectangular shape.

19. The package structure as claimed in claim 17, further comprising:

a transistor formed over the substrate; and an interconnect structure formed over the transistor, wherein the interconnect structure comprises a first top metal layer and a second top metal layer, the first through via is connected to the first top metal layer, the second through via is connected to the second top metal layer.

20. The package structure as claimed in claim 17, further comprising:

a second insulating layer formed over the first CTM layer; and a second CTM layer formed over the second insulating layer, wherein the second CTM layer is connected to the first through via.

* * * * *